(12) United States Patent
Cali

(10) Patent No.: US 6,600,371 B2
(45) Date of Patent: Jul. 29, 2003

(54) LOW NOISE AMPLIFIER

(75) Inventor: Giovanni Cali, Catania (IT)

(73) Assignee: STMicroelectronics s.r.l., Milan (IT)

( * ) Notice: Subject to any disclaimer, the term of this patent is extended or adjusted under 35 U.S.C. 154(b) by 0 days.

(21) Appl. No.: 09/990,200

(22) Filed: Nov. 21, 2001

(65) Prior Publication Data

US 2002/0093380 A1 Jul. 18, 2002

(30) Foreign Application Priority Data

Nov. 28, 2000 (IT) .................................... MI2000A2559

(51) Int. Cl.[7] ................................................ H03F 3/45
(52) U.S. Cl. ...................... 330/254; 330/149; 330/254; 330/257; 330/260; 330/261; 330/270; 330/271; 330/273; 330/279
(58) Field of Search ................................ 330/254, 149, 330/260, 282, 278, 279, 257, 261, 270, 271, 273

(56) References Cited

U.S. PATENT DOCUMENTS

| | | | | |
|---|---|---|---|---|
| 4,380,739 A | * | 4/1983 | Velo | 330/254 |
| 4,560,947 A | * | 12/1985 | Frey | 330/254 |
| 5,327,097 A | * | 7/1994 | Igarashi et al. | 330/254 |
| 5,532,637 A | * | 7/1996 | Khoury et al. | 327/359 |
| 5,587,689 A | * | 12/1996 | Bowers | 330/254 |
| 5,884,154 A | * | 3/1999 | Sano et al. | 455/321 |
| 5,999,056 A | * | 12/1999 | Fong | 330/278 |
| 6,100,759 A | * | 8/2000 | Sirna et al. | 330/252 |
| 6,124,761 A | * | 9/2000 | Robinson et al. | 330/254 |

* cited by examiner

*Primary Examiner*—Michael Tokar
*Assistant Examiner*—Linh Van Nguyen
(74) *Attorney, Agent, or Firm*—Lisa K. Jorgenson; Stephen Bongini; Fleit, Kain, Gibbons, Gutman & Bongini P.L.

(57) ABSTRACT

It is shown a low noise amplifier comprising a first circuit block suitable for converting a first amplifier input voltage signal into current, a second circuit block adapted to divide the current coming from said first block, said second block being controlled by a second voltage signal, said first and second blocks conferring a variable voltage gain to the amplifier. The amplifier comprises at least one first and at least one second resistors and a feedback network, said at least one first resistor connected with one first output terminal of said second block and with a supply voltage, and said at least one second resistor being connected between said at least one first and at least one second output terminals of said second block, and said feedback network being coupled with said at least one first terminal and with said first circuit block, and said at least one second terminal being coupled with at least one output terminal of said low noise amplifier.

20 Claims, 3 Drawing Sheets

LOW NOISE AMPLIFIER

BACKGROUND OF THE INVENTION

1. Field of the Invention

The present invention refers to a low noise amplifier, particularly to a radio frequency low noise amplifier.

2. Description of Related Art

In the field of telecommunication integrated devices a low noise amplifier is typically utilized as input stage for a receiver. Such amplifiers must assure besides a low noise in working frequency band thereof, even an efficient reduction of the distortion of the signals that are to be amplified.

Many problems of the same circuit of the amplifier are linked both to the optimisation of the noise and distortion performances and the control of the input impedance of the amplifier. Such problems have, above all in the radio frequency field, a basilar importance because the input impedance of the amplifier fixes, with a given source resistor, the adaptation conditions of the amplifier circuit at its interface with the input signal, thereby causing the ROS (Stationary Wave Ratio) of the receiver.

Open loop or feedback technologies can be utilized to control the input impedance of the low noise amplifiers. A typical circuit typology of a low noise amplifier that uses a feedback technology is shown in FIG. 1 where a differential stage is described which is constituted by two bipolar transistors Q10 and Q20 which have the emitter terminals connected with each other and with a current generator Iee, connected in turn with the voltage Vee, and the respective collector terminals connected with each emitter terminal of two bipolar transistors Q30 and Q40. Such transistors have each base terminal connected with a bias voltage VB and each collector terminal connected both with a resistor Rc, connected in turn with a supply voltage Vcc, and with a base terminal of the transistors Q50 and Q60 which have in turn the collector terminals connected with the supply voltage Vcc and the emitter terminals connected with current generators connected with the voltage Vee. The base terminals of the transistors Q10 and Q20, which represent the input terminals of the amplifier (which has in input a voltage VIN), are coupled with the emitter terminals of the transistors Q50 and Q60, which represent the output terminals OUT− and OUT+ of the amplifier, by means of a resistor RF. In such amplifier the input impedance is fixed by the feedback resistor RF and it is equal to:

$$Ri \approx \frac{2RF}{Av} = \frac{2RF}{g_{m1,2}Rc}$$

wherein Av is the voltage gain of the amplifier circuit. Since the input impedance in such circuit configuration of the amplifier is fixed by a physical resistor and by a voltage gain, it results constant in a very large frequency band and therefore it makes this circuit configuration adapted to the large band appliances.

However a circuit configuration as that in FIG. 1 does not allow to solve the distortion problem. An added specification required to a low noise amplifier is therefore the gain variability, in fact an adjustable gain allows to optimise the distortion performances of the amplifier. The gain variation can be controlled statically by a regulation with an external trimming or a software programming, or it can be controlled by means of a closed loop technology with an AGC (Automatic Gain Control) circuit. An amplifier employing a technology of the above mentioned type is shown in FIG. 2 where a differential stage is shown which is constituted by two bipolar transistors Q11 and Q21 the emitter terminals of which are connected with each other and with a current generator Iee, connected in turn with the voltage Vee, and the respective collector terminals connected with other two differential stages Q31, Q41 and Q51, Q61 and specifically with their emitter terminals. The collector terminals of the transistors Q31 and Q51 are connected with a resistor Rc, connected in turn with a supply voltage Vcc, and with a base terminal of the transistor Q70, while the collector terminals of the transistors Q41 and Q61 are connected with a resistor Rc, connected in turn with the supply voltage Vcc, and with the base terminal of the transistor Q80. The collector terminals of the transistors Q70 and Q80 are connected with the supply voltage Vcc while each one of the emitter terminals, which constitute respectively the output terminals OUT− and OUT+, is connected with a current generator connected with the voltage Vee. The base terminals of the transistors Q11 and Q21 constitute the input terminals of the amplifier (which has in input a voltage VIN), while between the common base terminal of the transistors Q41 and Q51 and the common base terminal of the transistors Q31 and Q61 a voltage Vc is applied which serves to regulate the gain of the low noise amplifier. By such a circuit configuration a maximum gain is obtained equal to:

$$Av_{MAX} = g_{m1,2}Rc$$

for example with a voltage Vc≧0.2V, while the minimum gain is obtained for example with Vc=0 and it is limited only by the incorrect coupling (mismatch) of the transistor couples belonging to the three differential stages.

However in such circuit configuration the input impedance cannot be correctly controlled; in fact the insertion of the variable gain does not allows to achieve a constant input impedance.

SUMMARY OF THE INVENTION

In view of the art described, it is an object of the present invention to provide a low noise amplifier that overcomes the aforementioned problem.

According to the present invention, such object is obtained by means of a low noise amplifier comprising a first circuit block suitable for converting a first amplifier input voltage signal into current, a second circuit block adapted to divide the current coming from said first block, said second block being controlled by a second voltage signal, said first and second blocks conferring a variable voltage gain to the amplifier, characterised by comprising at least one first and at least one second resistors and a feedback network said at least one first resistor connected with one first output terminal of said second block and with a supply voltage, and said at least one second resistor being connected between said at least one first and at least one second output terminals of said second block, and said feedback network being coupled with said at least one first terminal and with said first circuit block, and said at least one second terminal being coupled with at least one output terminal of said low noise amplifier.

Thanks to the present invention it is possible to provide a low noise amplifier having the variable gain and fixed input impedance features.

BRIEF DESCRIPTION OF THE DRAWINGS

The features and the advantages of the present invention will be made evident by the following detailed description of a particular embodiment thereof, illustrated as not limiting example in the annexed drawings, wherein.

DETAILED DESCRIPTION OF PREFERRED EMBODIMENTS

Figure 1:
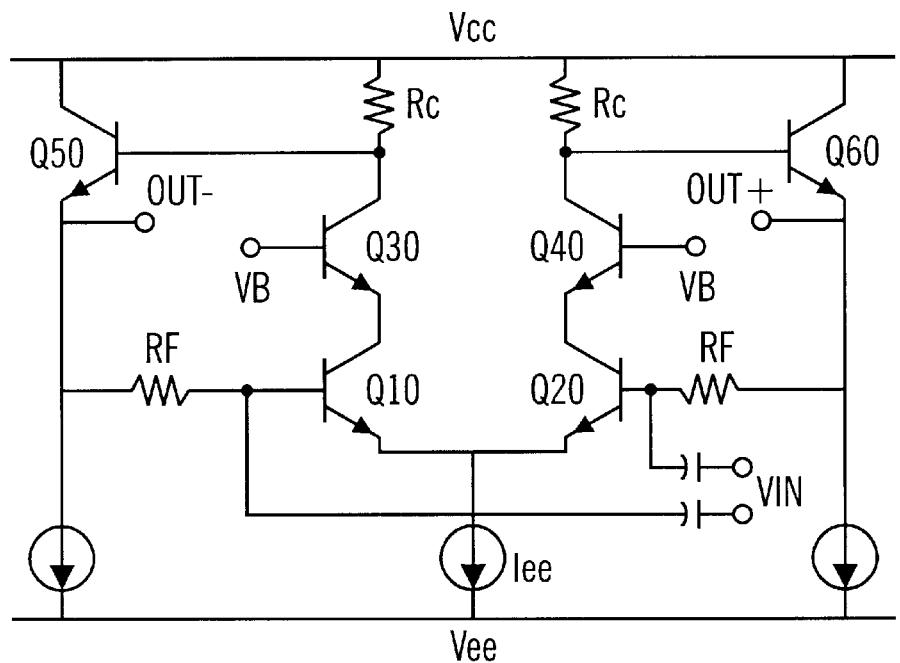
FIG. 1 is a circuit scheme of a first radio frequency low noise amplifier according to the prior art.
Figure 2:
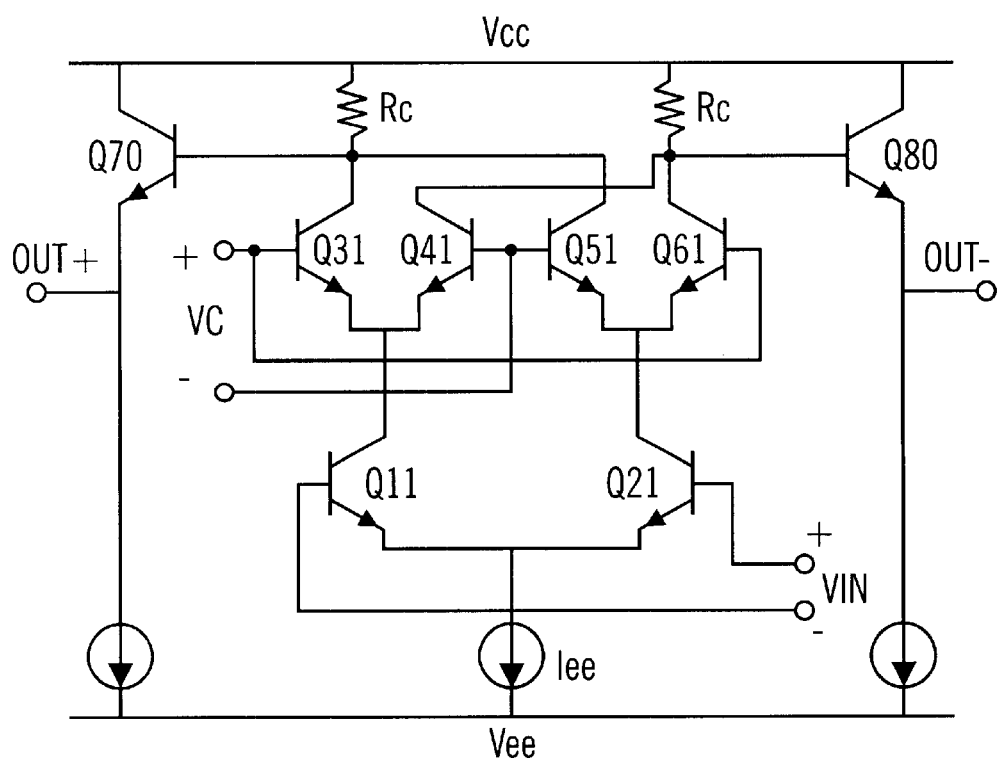
FIG. 2 is a circuit scheme of a second radio frequency low noise amplifier according to the prior art.
Figure 3:
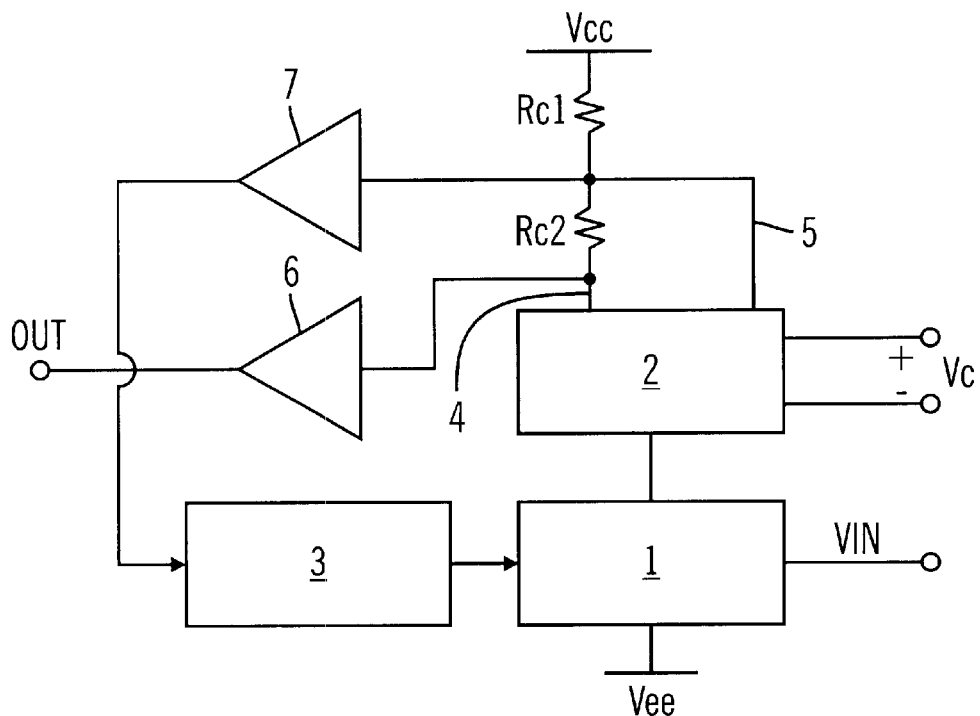
FIG. 3 is a circuit scheme of a radio frequency low noise amplifier according to the invention.

In FIG. 3 a circuit scheme of a radio frequency low noise amplifier according to invention is shown which comprises a voltage/current converter 1, which has in input a voltage VIN and which is connected with a voltage Vee and with a block 2 constituted by a current divider controlled by a voltage Vc. The block 1 and the block 2 give to the amplifier a variable voltage gain. The block 2 has two output terminals 4 and 5 which are connected respectively the first one with a terminal of a resistor Rc2 and the second one both with the other terminal of the resistor Rc2 and with a resistor Rc1 connected with the supply voltage Vcc. The output terminal 4 is connected with a buffer 6 the output of which represents the output OUT of the amplifier, while the second terminal 5 is connected with a buffer 7 the output of which is connected with a feedback network 3 connected with the voltage/current converter 1.

Figure 4:
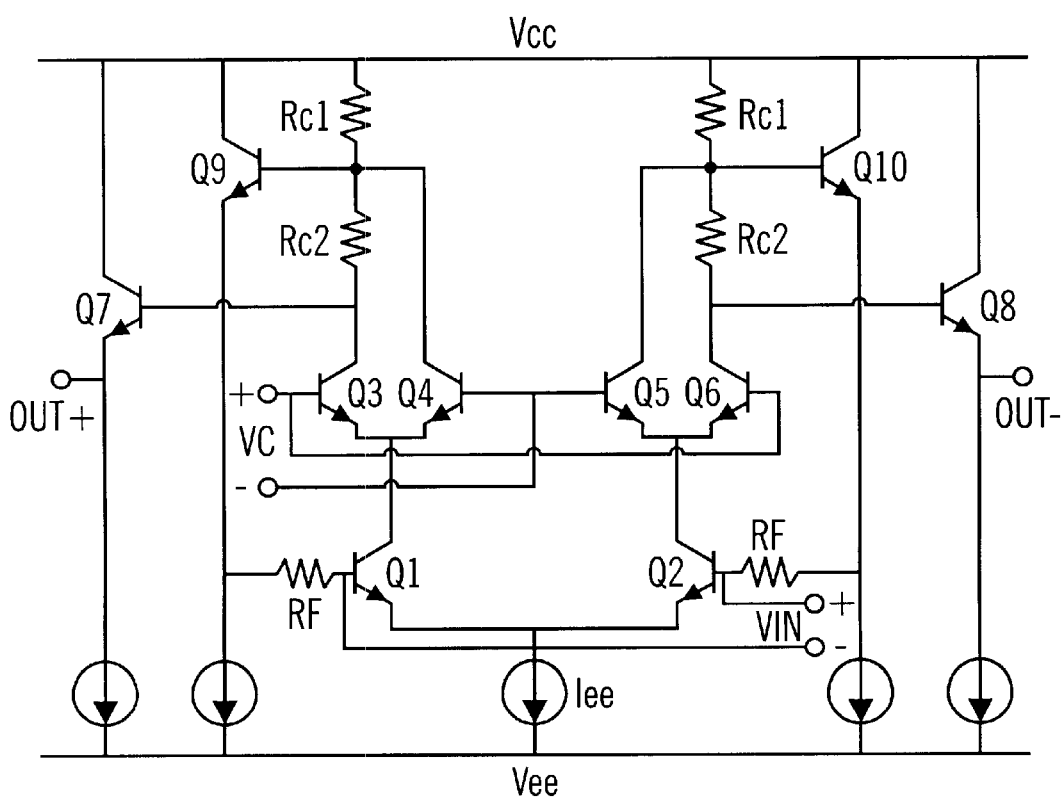
FIG. 4 is a more detailed circuit scheme of the amplifier in FIG. 3 according to a first embodiment of the present invention.

A more detailed circuit scheme of the amplifier in FIG. 3 according to a first embodiment of the invention is shown in FIG. 4. The voltage/current converter is constituted by a differential stage comprising two bipolar transistors Q1 and Q2 which have the emitter terminals connected to each other and with a current generator Iee, connected in turn with the voltage Vee, while the base terminals are the input of the low noise amplifier. The block 2 is constituted by two differential stages Q3, Q4 and Q5, Q6 the emitter terminals of which are connected with collector terminals of the differential stage Q1, Q2. Each collector terminal of the transistors Q4 and Q5 is connected with a resistor Rc1 having its other terminal connected with the voltage Vcc and with the resistor Rc2 having its other terminal connected with the collector terminal of the respective transistor Q3 or Q6. Each collector terminal of the transistors Q3 and Q6 is connected with the base terminal of respective transistors Q7 and Q8, which represent the buffer 6 and have the collector terminals connected with the supply voltage Vcc and the emitter terminals, which represent the amplifier output terminals OUT+ and OUT−, connected with respective current generators connected with the voltage Vee. Each collector terminal of the transistors Q4 and Q5 is connected with the base terminal of respective transistors Q9 and Q10, which represent the buffer 7 and have the collector terminals connected with the supply voltage Vcc and the emitter terminals connected with respective current generators connected with the voltage Vee and with the resistors RF, which represent the feedback network 3 and are connected with the base terminals of the transistors Q1 and Q2 which represent the input terminals of the amplifier having in input a voltage VIN. A voltage Vc, which allows to regulate the gain of the low noise amplifier, is applied between the common base terminal of the transistors Q4 and Q5 and the common base terminal of the transistors Q3 and Q6.

In the above mentioned circuit the voltage gain Av goes from a minimum gain given by:

$$Av_{MIN} = \frac{V(OUT+) - V(OUT-)}{VIN} = g_{m1,2}Rc1$$

which is obtained when the collector currents flow respectively through Q3 and Q6, for example with $Vc \leq -0.2V$, to a maximum gain given by:

$$Av_{MAX} = \frac{V(OUT+) - V(OUT-)}{VIN} = g_{m1,2}(Rc1 + Rc2)$$

which is obtained when the collector currents flow through Q4 and Q5, for example with $Vc \geq 0.2V$.

Therefore there is a voltage gain variation given by:

$$\Delta Av = Av_{MAX} - Av_{MIN} = g_{m1,2}Rc2$$

Since the whole collector current of Q1 and Q2 flows always through the resistors Rc1, the loop is closed by means of the transistors Q9 and Q10 with a constant loop gain given by:

$$Avloop = g_{m1,2}Rc1$$

The input impedance, which depends on the loop gain of the circuit, results thus constant and it is given by:

$$Ri \approx \frac{2RF}{Avloop} = \frac{2RF}{g_{m1,2}Rc}$$

Figure 5:
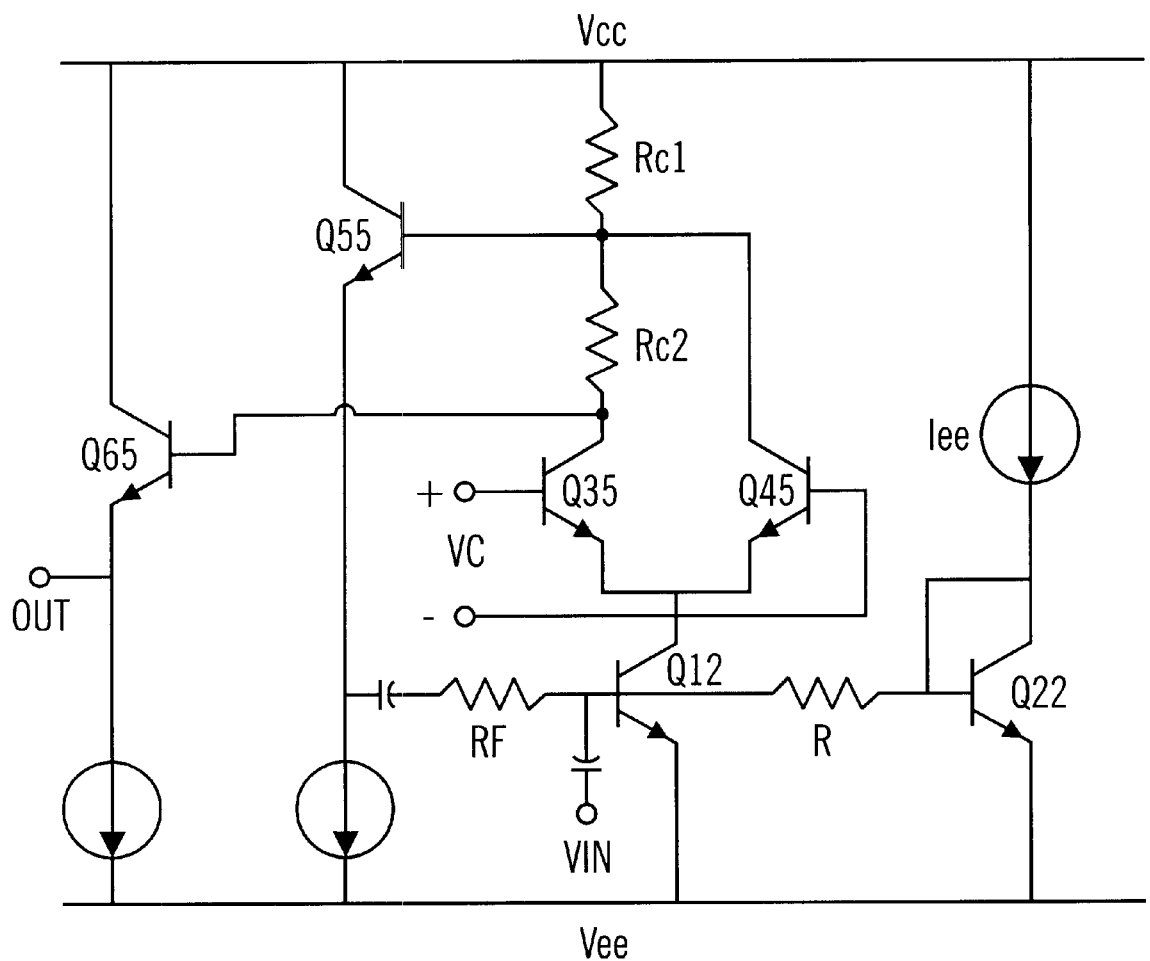
FIG. 5 is a more detailed circuit scheme of the amplifier in FIG. 3 according to a variant of the embodiment in FIG. 4.

In FIG. 5 a circuit scheme of a low noise amplifier according to a variant of the above mentioned embodiment is shown. The voltage/current converter 1 is constituted by a bipolar transistor Q12 having the emitter terminal connected with the voltage Vee and the base terminal, which constitutes the input of the low noise amplifier, is connected by means of a resistor RB with a diode connected transistor Q22 connected with the voltage Vee and with a current generator connected in turn with the supply voltage Vcc. The block 2 is constituted by a differential stage Q35, Q45 the emitter terminals of which are connected with the collector terminal of the transistor Q12. The collector terminal of the transistor Q45 is connected with a resistor Rc1 having its other terminal connected with the voltage Vcc and with a resistor Rc2 having its other terminal connected with the collector terminal of the respective transistor Q35. The collector terminal of the transistor Q35 is connected with the base terminal of a transistor Q65, which represents the buffer 6, that has the collector terminal connected with the supply voltage Vcc and the emitter terminal, which represents the amplifier output terminal OUT, connected with a current generator coupled with the voltage Vee. The collector terminal of the transistor Q45 is connected with the base terminal of a transistor Q55, which represents the buffer 7 and has the collector terminal connected with the supply voltage Vcc and the emitter terminal connected with a current generator connected with the voltage Vee and coupled with a resistors RF, which represent the feedback network 3 and is connected with the base terminal of the transistor Q12 which represent the input terminal of the amplifier having in input a voltage VIN. A voltage Vc, which allows to regulate the gain of the low noise amplifier, is applied between the base terminal of the transistor Q45 and the base terminal of the transistor Q35. Such single endeed circuit architecture is suitable for low voltage appliances, for example with a voltage lower than 2V.

What is claimed is:

1. A low noise amplifier comprising:
   a first circuit block suitable for converting a first amplifier input voltage signal into current, at least one input terminal of said first circuit block receiving said first amplifier input voltage;
   a second circuit block adapted to divide the current coming from said first circuit block, said second circuit block being controlled by a second voltage signal, and said first and second circuit blocks conferring a variable voltage gain to the amplifier;
   at least one first resistor;
   at least one second resistor; and
   a feedback network,
   wherein said at least one first resistor is connected with at least one first output terminal of said second circuit block and with a supply voltage,
   said at least one second resistor is connected between said at least one first output terminal and at least one second output terminal of said second circuit block,
   said feedback network is coupled with said at least one first output terminal and is directly connected to said at least one input terminal of said first circuit block which receives the first amplifier input voltage, so as to obtain a constant input impedance, and
   said at least one second output terminal is coupled with at least one output terminal of said low noise amplifier.

2. Amplifier according to claim 1, characterized by comprising a first buffer placed between said at least one second output terminal of the second circuit block and the at least one output terminal of said amplifier, and a second buffer placed between at least one first output of the second circuit block and said feedback network.

3. Amplifier according to claim 1, characterized in that said first block comprises a first transistor the input terminal of which is coupled with the input terminal of the amplifier, in that said second block comprises a second and a third transistors forming a differential stage, said second voltage signal being applied between the input terminals of said second and said third transistors, said amplifier comprising a first and a second resistors and consequently said second block having a first and a second output terminals coincident to the respective output terminals of said third and said second transistors, said feedback network comprising a resistor coupled with said first terminal and said second terminal of the first block, and said second terminal being coupled with a respective output terminal of the amplifier.

4. Amplifier according to claim 3, characterized in that the input terminals of said transistors are drivable terminals while the output terminals of said transistors are non-drivable terminals.

5. Amplifier according to claim 3, characterized in that said transistors are bipolar transistors.

6. Amplifier according to claim 3, characterized in that said transistors are MOS transistors.

7. Amplifier according to claim 3, characterized in that said transistors are biCMOS transistors.

8. Amplifier according to claim 3, further comprising current generators suitable for biasing said transistors.

9. A low noise amplifier comprising:
   a first circuit block suitable for converting a first amplifier input voltage signal into current,
   a second circuit block adapted to divide the current coming from said first block, said second block being controlled by a second voltage signal, said first and second blocks conferring a variable voltage gain to the amplifier,
   at least one first and at least one second resistors and a feedback network, said at least one first resistor connected with a first output terminal of said second block and with a supply voltage, and said at least one second resistor being connected between said at least one first and at least one second output terminals of said second block, and said feedback network being coupled with said at least one first terminal and with said first circuit block, and said at least one second terminal being coupled with at least one output terminal of said low noise amplifier,
   wherein said first block comprises a first and a second transistors forming a first differential stage, the input terminals of said transistors being the input terminals of the amplifier,
   said second block comprises a third and a fourth transistors forming a second differential stage and a fifth and a sixth transistors forming third differential stage, said third and said sixth transistors having a first input terminal in common and said fourth and said fifth transistors having a second input terminal in common and said second voltage signal being applied between said first and said second input terminals,
   said amplifier comprising two first resistors and two second resistors and consequently said second block having two first output terminals and two second output terminals, one of said first output terminals being the output terminal of said fourth transistor and the other of said two first output terminals being the output terminal of said fifth transistor, one of said two second output terminals being the output terminal of said third transistor and the other of said two second output terminals being the output terminal of said sixth transistor, and
   said feedback network comprising two resistors each coupled with one of said two first input terminals of the second block and with one of said two respective input terminals of the first and second transistor of the first block, and said two output terminals of the second block being coupled with two respective output terminals of the amplifier.

10. Amplifier according to claim 9, characterized in that the input terminals of said transistors are drivable terminals while the output terminals of said transistors are non-drivable terminals.

11. Amplifier according to claims claim 9, characterized in that said transistors are bipolar transistors.

12. Amplifier according to claim 9, characterized in that said transistors are MOS transistors.

13. Amplifier according to claim 9, characterized in that said transistors are biCMOS transistors.

14. Amplifier according to claim 9, further comprising current generators suitable for biasing said transistors.

15. An integrated circuit including at least one low noise amplifier, said low noise amplifier comprising:
   a first circuit block suitable for converting a first amplifier input voltage signal into current, at least one input terminal of said first circuit block receiving said first amplifier input voltage;
   a second circuit block adapted to divide the current coming from said first circuit block, said second circuit block being controlled by a second voltage signal, and said first and second circuit blocks conferring a variable voltage gain to the amplifier;

at least one first resistor;

at least one second resistor; and a feedback network, wherein said at least one first resistor is connected with at least one first output terminal of said second circuit block and with a supply voltage, said at least one second resistor is connected between said at least one first output terminal and at least one second output terminal of said second circuit block, said feedback network is coupled with said at least one first output terminal and is directly connected to said at least one input terminal of said first circuit block which receives the first amplifier input voltage, so as to obtain a constant input impedance, and said at least one second output terminal is coupled with at least one output terminal of said low noise amplifier.

16. The integrated circuit according to claim 15, wherein said low noise amplifier further comprises a first buffer placed between said at least one second output terminal of the second circuit block and the at least one output terminal of said amplifier, and a second buffer placed between at least one first output of the second circuit block and said feedback network.

17. The integrated circuit according to claim 15, wherein said first block comprises a first and a second transistors forming a first differential stage, the input terminals of said transistors being the input terminals of the amplifier, said second block comprises a third and a fourth transistors forming a second differential stage and a fifth and a sixth transistors forming third differential stage, said third and said sixth transistors having a first input terminal in common and said fourth and said fifth transistors having a second input terminal in common and said second voltage signal being applied between said first and said second input terminals, said amplifier comprising two first resistors and two second resistors and consequently said second block having two first output terminals and two second output terminals, one of said first output terminals being the output terminal of said fourth transistor and the other of said two first output terminals being the output terminal of said fifth transistor, one of said two second output terminals being the output terminal of said third transistor and the other of said two second output terminals being the output terminal of said sixth transistor, and said feedback network comprising two resistors each coupled with one of said two first input terminals of the second block and with one of said two respective input terminals of the first and second transistor of the first block, and said two output terminals of the second block being coupled with two respective output terminals of the amplifier.

18. The integrated circuit according to claim 15, wherein said first block comprises a first transistor the input terminal of which is coupled with the input terminal of the amplifier, in that said second block comprises a second and a third transistors forming a differential stage, said second voltage signal being applied between the input terminals of said second and said third transistors, said amplifier comprising a first and a second resistors and consequently said second block having a first and a second output terminals coincident to the respective output terminals of said third and said second transistors, said feedback network comprising a resistor coupled with said first terminal and said second terminal of the first block, and said second terminal being coupled with a respective output terminal of the amplifier.

19. The integrated circuit according to claim 15, wherein the input terminals of said transistors are drivable terminals while the output terminals of said transistors are non-drivable terminals.

20. The integrated circuit according to claim 15, wherein said low noise amplifier further comprises current generators suitable for biasing said transistors.

* * * * *

UNITED STATES PATENT AND TRADEMARK OFFICE
CERTIFICATE OF CORRECTION

PATENT NO. : 6,600,371 B2  Page 1 of 1
DATED : July 29, 2003
INVENTOR(S) : Giovanni Cali'

It is certified that error appears in the above-identified patent and that said Letters Patent is hereby corrected as shown below:

Title page,
Item [75], Inventor, change "Cali" to -- Cali' --
Item [73], Assignee, change "Milan" to -- Agrate Brianza --.

Signed and Sealed this

Twenty-third Day of November, 2004

JON W. DUDAS
*Director of the United States Patent and Trademark Office*